(12) United States Patent
Weir et al.

(10) Patent No.: US 8,624,352 B2
(45) Date of Patent: Jan. 7, 2014

(54) MITIGATION OF DETRIMENTAL BREAKDOWN OF A HIGH DIELECTRIC CONSTANT METAL-INSULATOR-METAL CAPACITOR IN A CAPACITOR BANK

(75) Inventors: Bonnie E. Weir, Bronxville, NY (US); Edward B. Harris, Fogelsville, PA (US); Ramnath Venkatraman, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 258 days.

(21) Appl. No.: 12/953,624

(22) Filed: Nov. 24, 2010

(65) Prior Publication Data

US 2012/0126364 A1 May 24, 2012

(51) Int. Cl.
 *H01L 23/52* (2006.01)
(52) U.S. Cl.
 USPC ............... 257/529; 257/E27.009; 438/238
(58) Field of Classification Search
 USPC .......... 257/529, E27.009; 438/210, 238, 393, 438/396
 See application file for complete search history.

(56) References Cited

U.S. PATENT DOCUMENTS

| 7,428,137 | B2 | 9/2008 | Dowgiallo, Jr. | |
|---|---|---|---|---|
| 2004/0115875 | A1* | 6/2004 | Voldman et al. | 438/200 |
| 2006/0120020 | A1* | 6/2006 | Dowgiallo, Jr. | 361/313 |
| 2009/0109725 | A1* | 4/2009 | Schulte et al. | 365/96 |

* cited by examiner

*Primary Examiner* — Thao Le
*Assistant Examiner* — Matthew Gordon (57) ABSTRACT

An IC capacitor bank includes a plurality of high-k metal-insulator-metal (MIM) capacitors connected to a pair of conductive traces. A fusible trace located on an end of one of the pair of conductive traces forms a capacitor column connected between supply lines, such that failure of a dielectric in the MIM capacitors causes the fusible trace to at least partially open thereby limiting a fault current in the capacitor column. Additionally, a method of manufacturing an IC capacitor bank includes providing a plurality of high-k metal-insulator-metal (MIM) capacitors connected to a pair of conductive traces and locating a fusible trace on an end of the pair of conductive traces to form a capacitor column that is connected between supply lines, such that failure of a dielectric in the MIM capacitors causes the fusible trace to at least partially open thereby limiting a fault current in the capacitor column.

20 Claims, 7 Drawing Sheets

MITIGATION OF DETRIMENTAL BREAKDOWN OF A HIGH DIELECTRIC CONSTANT METAL-INSULATOR-METAL CAPACITOR IN A CAPACITOR BANK

TECHNICAL FIELD

The present disclosure is directed, in general, to an integrated circuit and, more specifically, to an integrated circuit capacitor bank and a method of manufacturing an integrated circuit capacitor bank.

BACKGROUND

An example of a specialized decoupling capacitor is the Metal-Insulator-Metal (MIM) capacitor. MIM capacitors may be formed on an integrated circuit chip and typically provide a greater unit capacitance density (e.g., femtofarads per square micrometer ($fF/\mu m^2$)) than gate-oxide based capacitors. MIM capacitors offer significant advantages in enhancing high-performance circuits by filtering switching noise, especially for power supply lines. To improve their filtering capability, a group of MIM capacitors is often ganged together to form a bank of capacitors. Although these capacitor banks generally perform adequately, failure of one or more of the MIM capacitors typically becomes problematic. Therefore, improvements in this area would prove beneficial in the art.

SUMMARY

Embodiments of the present disclosure provide an integrated circuit (IC) capacitor bank and a method of manufacturing an IC capacitor bank. In one embodiment, the IC capacitor bank includes a plurality of high dielectric constant (high-k) metal-insulator-metal (MIM) capacitors connected together in parallel to a pair of conductive traces. Additionally, the IC capacitor bank also includes a fusible trace located on an end of one of the pair of conductive traces to form a capacitor column that is connected between a pair of supply lines, such that failure of a dielectric in one of the MIM capacitors causes the fusible trace to at least partially open thereby limiting a fault current in the capacitor column.

In another aspect, the present disclosure provides a method of manufacturing an integrated circuit (IC) capacitor bank. The method includes providing a plurality of high dielectric constant (high-k) metal-insulator-metal (MIM) capacitors and connecting the plurality of MIM capacitors together in parallel to a pair of conductive traces. The method also includes locating a fusible trace on an end of one of the pair of conductive traces to form a capacitor column that is connected between a pair of supply lines, such that failure of a dielectric in one of the MIM capacitors causes the fusible trace to at least partially open thereby limiting a fault current in the capacitor column.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Figure 1:
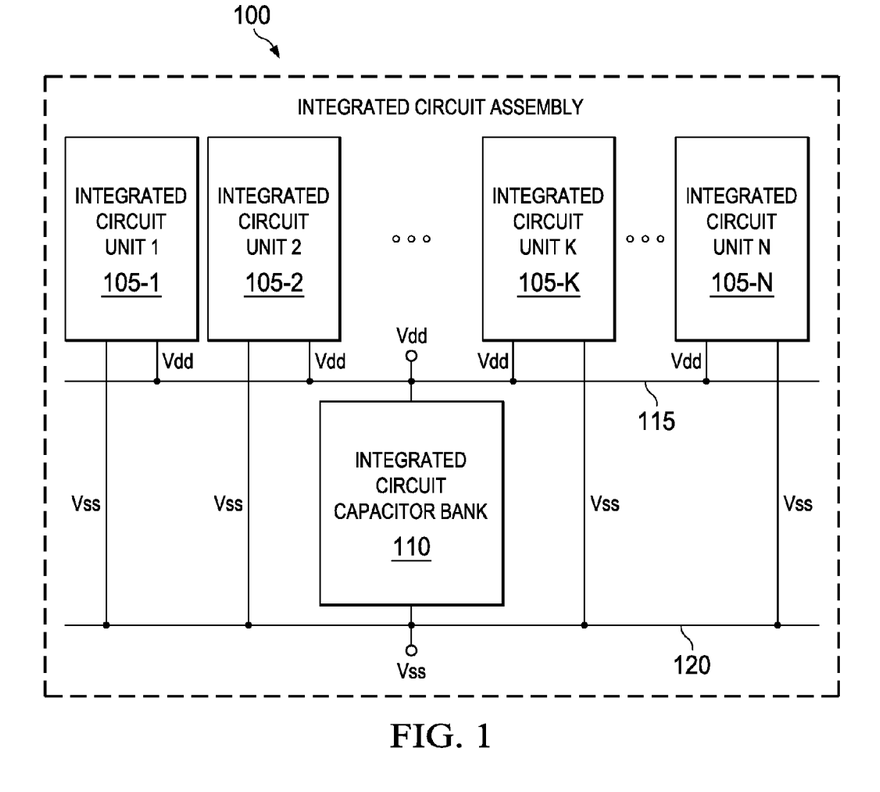
FIG. 1 illustrates a diagram of an embodiment of an integrated circuit (IC) assembly constructed according to the principles of the present disclosure.

FIG. 1 illustrates a diagram of an embodiment of an integrated circuit (IC) assembly, generally designated 100, constructed according to the principles of the present disclosure. The IC assembly 100 includes a collection of IC units 105-1, 105-N, an IC capacitor bank 110 and a pair of supply lines 115, 120 that are connected to each of the collection of IC units 105-1,105-N and the IC capacitor bank 110, as shown. The supply line 115 provides a current sourcing voltage Vdd, and the supply line 120 provides a current sinking voltage Vss. In alternate embodiments, the pair of supply lines 115, 120 may provide a current sourcing voltage and a common reference point (such as a ground reference) or a current sinking voltage and a common reference point.

The collection of IC units 105-1,105-N represent various digital or analog circuits that share the pair of supply lines 115,120. Each of the collection of IC units 105-1,105-N produces high frequency noise signals on the pair of supply lines 115, 120 that may interfere with its own operation or the operation of another unit. The IC capacitor bank 110 provides a significant number of IC capacitors that are connected in parallel across the pair of supply lines 115, 120 to provide filtering of these high frequency noise signals thereby reducing their overall detrimental effect.

High dielectric constant (high-k) metal-insulator-metal (MIM) capacitors may be formed on an IC chip and typically provide a greater unit capacitance density than gate-oxide based capacitors thereby providing a greater interference filtering capability. Therefore, the IC capacitor bank 110 typically employs multiple capacitor columns having a plurality of high-k MIM capacitors. However, high-k MIM capacitors suffer from low time dependent dielectric breakdown (TDDB) lifetimes, resulting in the inability to use them reliably in many important applications (e.g., using them for a one volt supply voltage at 125 C for 10 years).

In each capacitor column of the IC capacitor bank 110, the plurality of high-k MIM capacitors is parallel connected together to a pair of conductive traces. A fusible trace is located on an end of one of the pair of conductive traces to form a capacitor column that is connected between the pair of supply lines 115, 120, such that failure of a dielectric in one of the high-k MIM capacitors causes the fusible trace to at least partially open thereby limiting a fault current in the capacitor column.

The term "failure of a dielectric", as employed in this disclosure, means that the dielectric in one of the MIM capacitors has undergone a breakdown in its insulating properties to an extent that it no longer functions as a sufficient electrical insulator between its two metal conductors. This dielectric breakdown failure results in a fault current flowing through the two metal conductors that is provided by connected supply lines (e.g., the pair of supply lines 115, 120), and is much larger than an initial leakage current in the MIM capacitor. This fault current, if left unchecked, typically impairs or inhibits proper operation of one or more of the supply lines connected to the capacitor bank. Additionally, this fault current may cause failure of other integrated circuit units connected to the supply lines. The fusible trace provides protection against this failure condition by reducing the fault current to a value that allows proper operation of the supply lines.

The term "at least partially open", as employed in this disclosure, means that the fusible trace has significantly increased its electrical resistance value from its initial or operating electrical resistance value. In some embodiments, the fusible trace is designed to totally open becoming, for all practical purposes, an electrical open circuit thereby isolating its capacitor column from the capacitor bank and rendering its capacitor column non-operational. In other embodiments, the fusible trace is designed to increase its electrical resistance to a value high enough to render its capacitor column non-operational in the capacitor bank, although the fusible trace is not totally an open circuit.

Figure 2A:
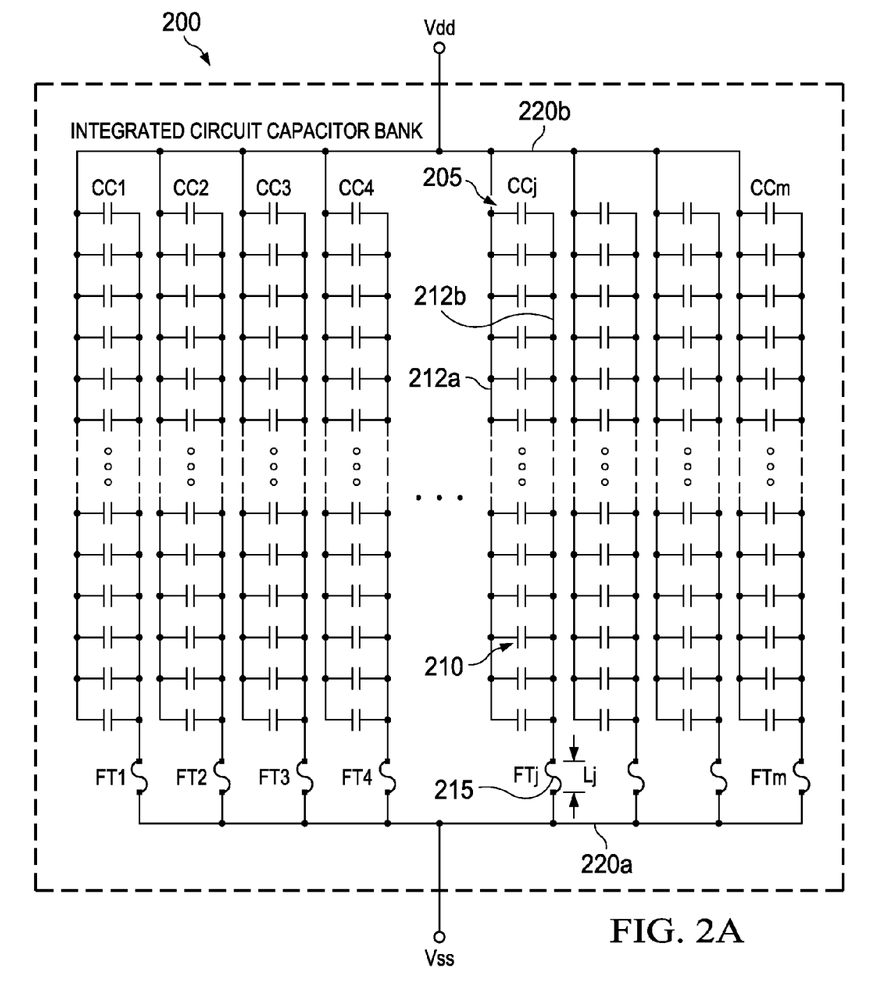
FIGS. 2A and 2B illustrate diagrams of an embodiment of an IC capacitor bank, generally designated 200, 250, constructed according to the principles of the present disclosure.
Figure 2B:
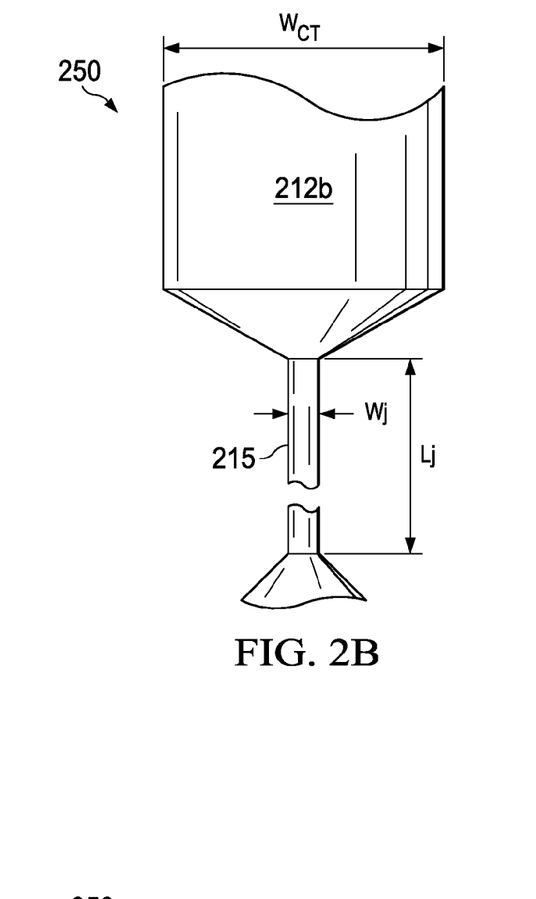

FIGS. 2A and 2B illustrate diagrams of an embodiment of an IC capacitor bank, generally designated 200, 250, constructed according to the principles of the present disclosure. The IC capacitor bank 200 of FIG. 2A includes multiple capacitor columns CC1-CCm wherein a capacitor column 205 (CCj) may be considered to be typical. The capacitor column 205 includes a plurality of high-k MIM capacitors 210 that are parallel connected to a fusible trace 215 (FTj). In some embodiments, subsets of the multiple capacitor columns CC1-CCm may employ differing high-k MIM capacitors or differing types of fusible traces as deemed appropriate.

Each of the capacitor columns CC1-CCm has a fusible trace 215 that provides a narrow path connection to the plurality of high-k MIM capacitors 210 within each capacitor column CC1-CCm. It should be understood, however, that though FIG. 2A shows that the fusible trace 215 of each capacitor column CC1-CCm is connected to Vss (a supply line 220a), other embodiments provide that the fusible trace 215 of each capacitor column CC1-CCm may be connected to Vdd (a supply line 220b), and in yet other embodiments some of the fusible traces 215 may be connected to Vdd while others are connected to Vss.

FIG. 2A illustrates that the fusible trace 215 has a fusible trace length $L_j$, as shown. FIG. 2B also shows the fusible trace length $L_j$ and additionally illustrates the conductive trace 212b having a conductive trace width $W_{CT}$ and the fusible trace 215 having a fusible trace width $W_j$. The fusible trace width $W_j$ is designed to provide a fusible trace width that is less than the narrower width of the conductive traces 212a, 212b connected to the plurality of high-k MIM capacitors 210, such that a ratio of conductive trace width $W_{CT}$ to fusible trace width $W_j$ ranges from about 9:1 to 12:1 (widths not drawn to scale in FIG. 2B). In an alternative embodiment where the width of the conductive traces 212a, 212b are the same, the width is less than the width of either of the conductive traces 212a, 212b. This narrow path allows a high percentage of the heating energy afforded by a fault current to be directed to the fusible trace 215.

In the illustrated embodiment, the fault current corresponds to a capacitor column current ranging from about one to five milliamperes, as compared to a background leakage current level of about 10 femtoamperes. Of course, the fusible trace 215 may be designed to provide protection for other fault current ranges, as deemed appropriate. The fusible trace 215 may include a fusing material that is selected from the group consisting of polycrystalline silicon, silicided poly-silicon, tantalum nitride and a fusible metal, for example. The fusible metal may be copper or another fusible metal compatible for inclusion in an IC containing the fusible trace 215. Accordingly, the fusible trace 215 being at least partially open corresponds to the fusing material selected providing an electrical resistance increase that is at least 50 times greater than an initial electrical resistance of the fusible trace 215.

Assume that the capacitor column 205 provides a worst case capacitance of about 0.2 picofarads. A maximum initial electrical resistance corresponding to a frequency response requirement for the capacitor column 205, for example, may be determined as shown below.

$$\omega_{3db} = 2\pi f_{3dB} = \frac{1}{RC}, \quad (1)$$

and $$R = \frac{1}{2\pi f_{3dB} C},$$

where R is the maximum initial electrical resistance of the fusible trace 215, C is the worst case capacitance of the capacitor column 205 and $f_{3dB}$ is the −3 dB frequency for the combination RC.

Then, for C≅0.2 pF and an $f_{3dB}$ equal to about one gigahertz:

$$R = (7.96)\frac{10^{11}}{f_{3dB}}, \text{ and} \quad (2)$$

therefore R≅796 ohms.

The initial electrical resistance of the fusible trace 215 may be as high as about 796 ohms for the capacitor column 205 to function efficiently. This condition may be met employing silicided poly-silicon or copper, for example.

Generally, selecting an initial electrical resistance of a fusible trace to be a value proximate the high end of an acceptable resistance range provides an additional benefit in fault current management for a capacitor bank or a system-on-chip (SOC) that employs the capacitor bank. For a case where the fusible trace fails to at least partially open during a fault condition, the initial electrical resistance of the fusible trace provides a measure of fault current limiting by itself. This feature may further allow the capacitor bank to degrade gracefully in operation instead of failing outright.

As discussed with respect to FIG. 1, TDDB lifetimes are typically problematic for high-k MIM capacitors. Additionally, capacitor banks are often subject to a failure criterion (e.g., as part of an SOC) that may not be exceeded. For example, the failure criterion may require a failure rate of no more than 1,000 parts per million (ppm) in 10 years at 125 C. Assume that 90 percent of the fusible traces at least partially open and 10 percent of the fusible traces fail to at least partially open (i.e., remain intact) after a dielectric breakdown event. The failure rate of the fusible traces may be increased to 10,000 ppm thereby ensuring that only 1,000 ppm will have their function impaired. A lifetime for 1,000 ppm at 1.0V and 125 C is 3.5 years, while a lifetime for 10,000 ppm at 1.0V and 125 C is 18.6 years, thereby exceeding the required 10 years at 125 C by a comfortable margin.

Figure 3A:
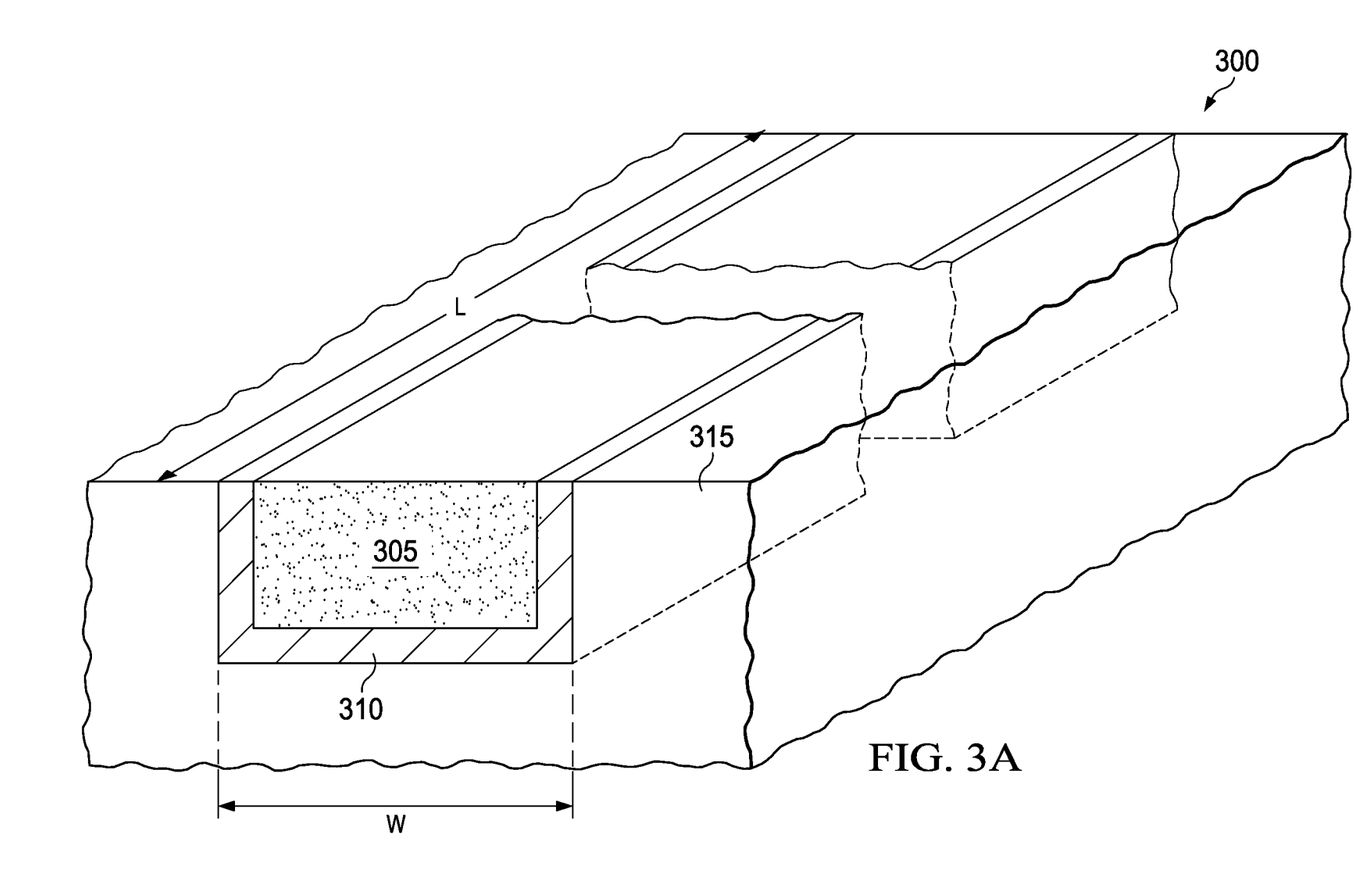
FIGS. 3A and 3B illustrate sectional views of an embodiment of a fusible trace that includes a composite structure constructed according to the principles of the present disclosure.
Figure 3B:
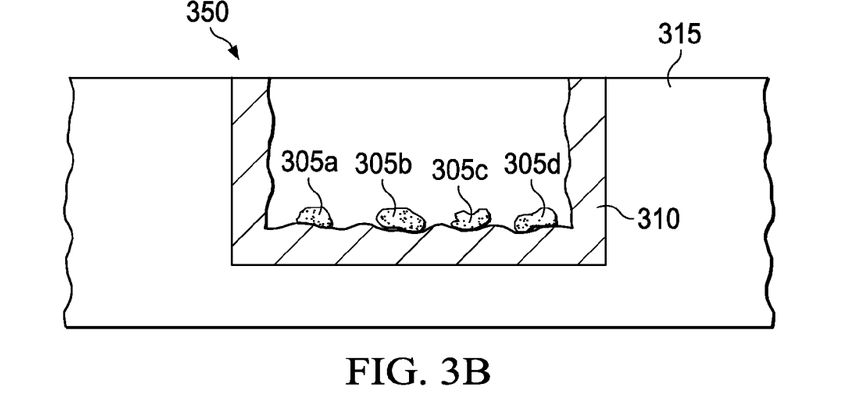

FIGS. 3A and 3B illustrate sectional views of embodiments of a fusible trace 300, 350, respectively. FIG. 3A shows the fusible trace 300 in a closed configuration, while FIG. 3B shows the fusible trace 350 in an opened configuration. The fusible trace 300 shown in FIG. 3A includes a composite structure, which in one embodiment comprises a runner portion 305 and a liner/barrier layer 310, which are located in an IC substrate 315, as may be employed in an embodiment of a capacitor column described herein. In the illustrated embodiment, the liner/barrier layer 310 determines an increase in electrical resistance for limiting a fault current in the capacitor column. The liner/barrier layer 310 may be a metal liner, for example such as tantalum nitride or titanium nitride and the like. The runner portion 305 may be any one of or a combination of the group of fusing materials discussed above with respect to FIG. 2.

The fusible trace 300 may be seen to have a fusible trace length L, corresponding to the fusible trace length Lj in FIG. 2A, and a fusible trace width W, corresponding to the fusible trace width $W_j$ in FIG. 2B. Generally, the fusible trace 300 provides a narrow path length to width ratio (L/W) ranging from about 100:1 to 150:1. For 40 nanometer technology, an embodiment of the fusible trace 300 employs a fusible trace length L of about 5 microns and a fusible trace width W of about 0.04 microns. These quantities provide a fusible trace length to width ratio (L/W) of about 125.

A change in resistance of the fusible trace 300, when it becomes at least partially open, is proportional to cross-sectional areas of the runner portion 305 and liner/barrier layer 310 and their respective resistivities. For example, assume that the cross-sectional areas are equal, the runner portion 305 is copper and the liner/barrier layer 310 is tantalum, nitride. The resistivity of tantalum nitride is approximately 200 uohm-cm as compared to approximately three uohm-cm for copper interconnect. This provides at least a partially open resistance increase that is 200/3 or about 66 times greater than an initial electrical resistance for the assumed equal cross-sectional areas. Of course this ratio may be modified for the same fusing materials by appropriately changing the cross-sectional areas of the runner portion 305 and liner/barrier layer 310.

FIG. 3B shows a sectional view of the fusible trace 350 that has, at least, partially opened in response to a dielectric failure. Subsequent to being opened, the fusible trace 350 includes remaining remnants 305a-305d of the runner portion 305 (FIG. 3A) and the liner/barrier layer 310 in the substrate 315. As seen in FIG. 3B, the remaining remnants 305a-305d indicate that the previous runner portion 305, as seen in FIG. 3A, has totally opened electrically leaving only the liner/barrier layer 310 mostly intact. This condition provides a partially open resistance increase to render its associated capacitor column non-operational, although the fusible trace 350 is not totally open electrically. However, it should be understood that the liner/barrier layer 310 may also be substantially removed due to the dielectric failure.

Figure 4:
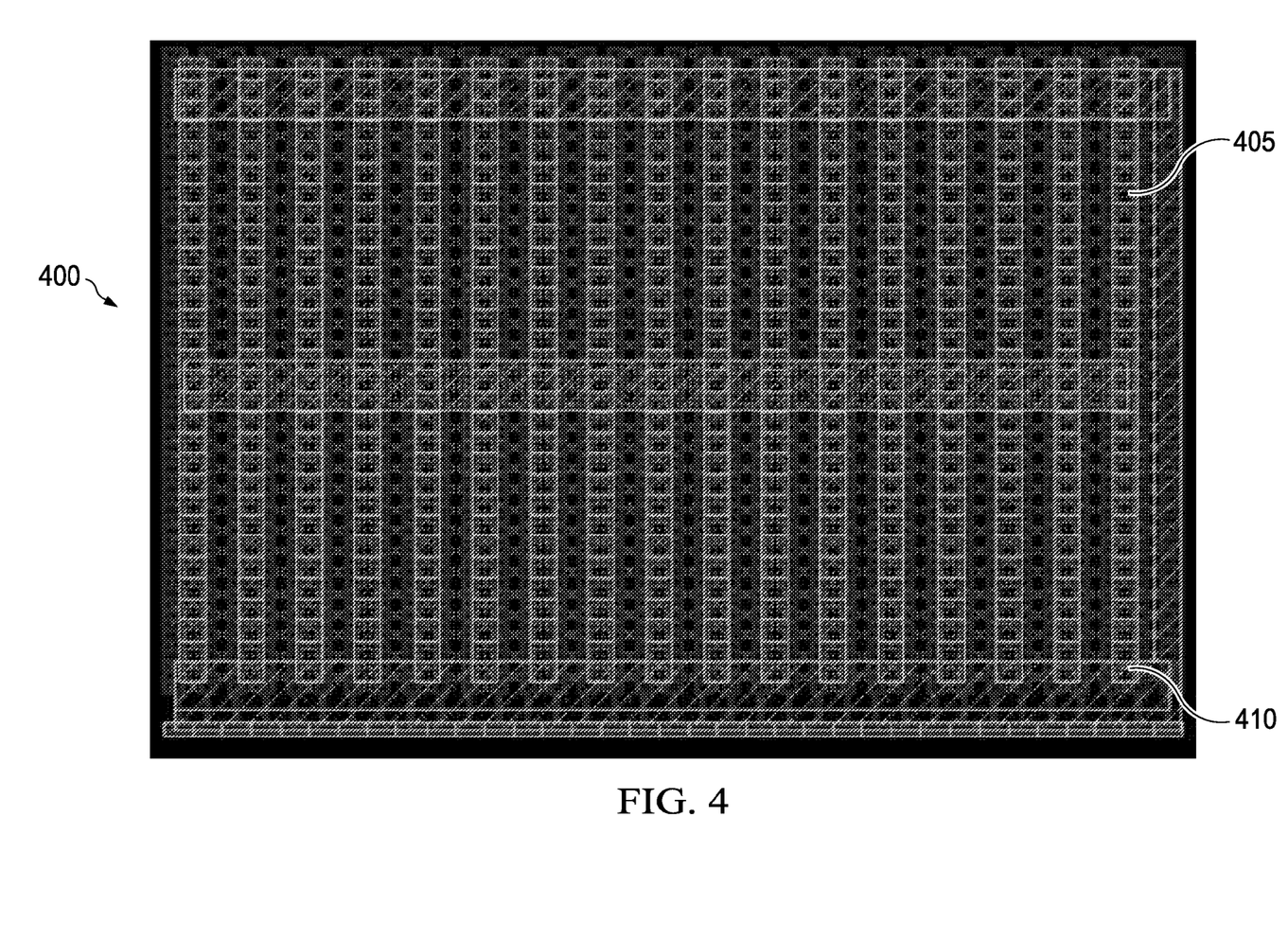
FIG. 4 illustrates a pictorial view of an embodiment of an IC capacitor bank constructed according to the principles of the present disclosure.

FIG. 4 illustrates a pictorial view of an embodiment of an IC capacitor bank, generally designated 400, constructed according to the principles of the present disclosure. The IC capacitor bank 400 includes multiple capacitor columns (a capacitor column 405 is typical) wherein each is protected by one of multiple fusible traces (a fusible trace 410 is typical) that are constructed of silicided poly-silicon and located at a same supply line end of the capacitor bank 400. As discussed previously, other embodiments may employ some of the multiple fusible traces located at one supply line end of the capacitor bank 400 and remaining ones located at the other supply line end of the capacitor bank 400.

Figure 5:
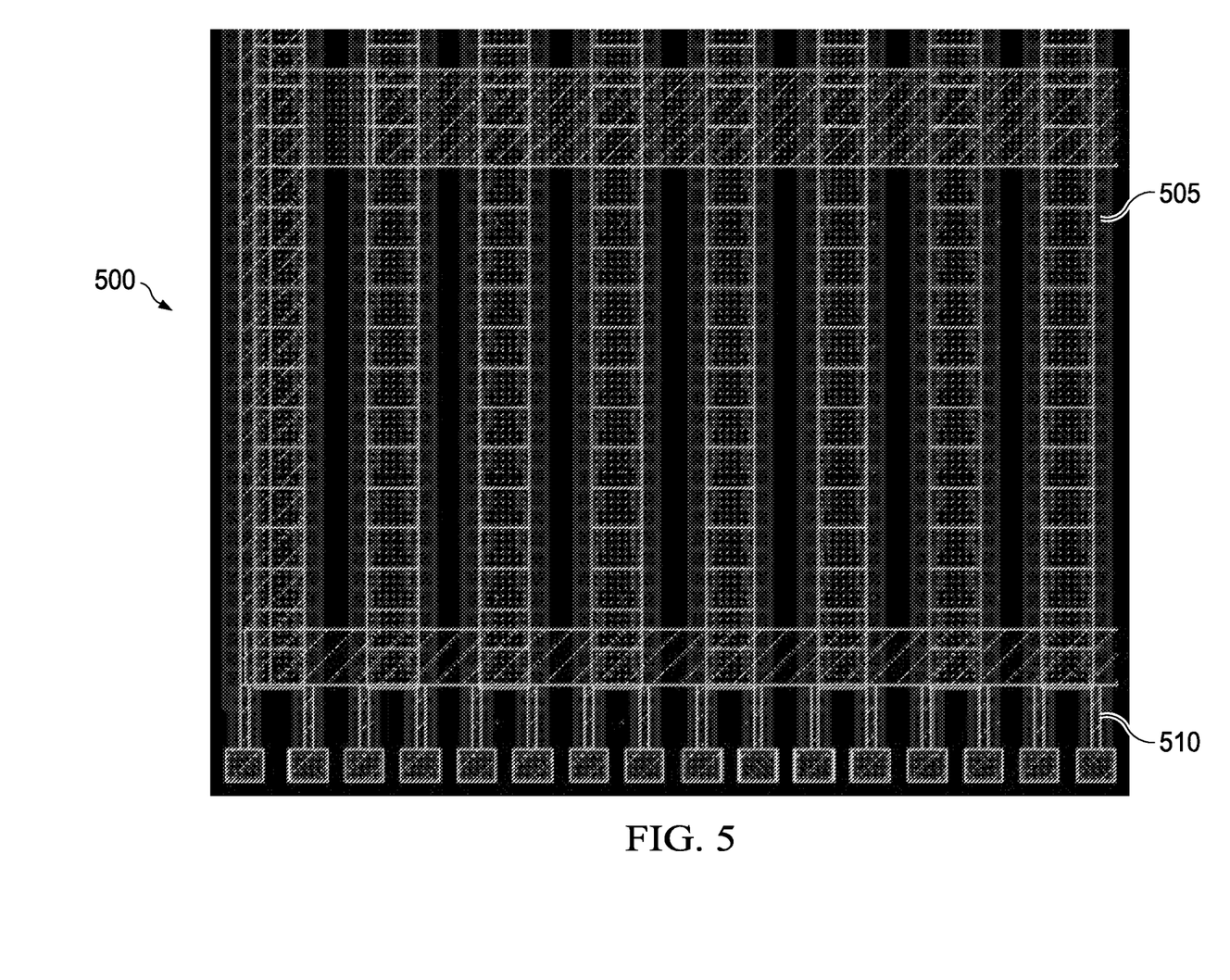
FIG. 5 illustrates a pictorial view of another embodiment of an IC capacitor bank constructed according to the principles of the present disclosure.

FIG. 5 illustrates a pictorial view of another embodiment of an IC capacitor bank, generally designated 500, constructed according to the principles of the present disclosure. The IC capacitor bank 500 includes multiple capacitor columns (a capacitor column 505 is typical) wherein each is protected by a corresponding fusible trace (a fusible trace 510 being typical) that is constructed of copper and located at a same supply line end of the capacitor bank 500. As before, other embodiments may employ some fusible traces located at one supply line end of the capacitor bank 500 and remaining ones located at the other supply line end of the capacitor bank 500.

Figure 6:
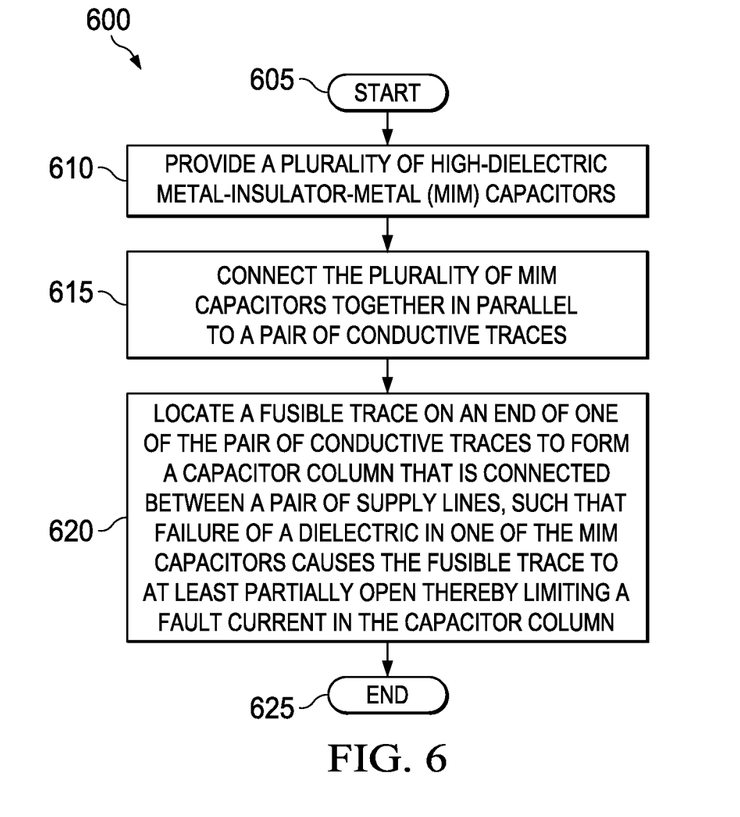
FIG. 6 illustrates an embodiment of a method of manufacturing an IC capacitor bank carried out according to the principles of the present disclosure.

FIG. 6 illustrates an embodiment of a method of manufacturing an integrated circuit (IC) capacitor bank, generally designated 600, carried out according to the principles of the present disclosure. The method 600 starts in a step 605, and a plurality of high-k metal-insulator-metal (MIM) capacitors is provided in a step 610. Then, in a step 615, the plurality of MIM capacitors is parallel connected together to a pair of conductive traces. A fusible trace is located on an end of one of the pair of conductive traces to form a capacitor column that is connected between a pair of supply lines in a step 620, such that failure of a dielectric in one of the MIM capacitors causes the fusible trace to at least partially open thereby limiting a fault current in the capacitor column.

In one embodiment, the pair of supply lines provides a current sourcing voltage and a current sinking voltage, a current sourcing voltage and a common reference point or a current sinking voltage and a common reference point. Accordingly, the common reference point may provide a local, chip or system ground reference. In one application, the fault current in the capacitor column may be limited to a range of about one to five milliamperes. The fusible trace, designed for this fault current value, is caused to at least partially open and reduce the fault current to an acceptable lower value commensurate with allowing the pair of supply lines to continue to operate as intended.

In another embodiment, the fusible trace includes a fusing material that is selected from the group consisting of polycrystalline silicon, silicided poly-silicon, tantalum nitride and a fusible metal. In one application, the fusible trace provides a width that is less than the narrower width of the pair of conductive traces connected to it such that a ratio of conductive trace width to fusible trace width ranges from about 9:1 to 12:1. In another application, a length to width ratio of the fusible trace may range from about 100:1 to 150:1. In still another application, the fusible trace increases its electrical resistance by at least 50 times when it is at least partially open, over its initial electrical resistance.

In still another embodiment, the fusible trace includes a composite structure having a runner portion and a liner/barrier layer. In one application, the fusible trace includes a path liner that determines an increase in electrical resistance for limiting the fault current in the capacitor column. In another application, the path liner is a refractory metal liner. The method 600 ends in a step 625.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which the disclosure relates will appreciate that other and further additions, deletions, substitutions and modifications may be made to the described example embodiments without departing from the disclosure.

What is claimed is:

1. An IC capacitor bank, comprising:
a plurality of capacitor columns, wherein each of the capacitor columns includes:
a plurality of high dielectric constant (high-k) metal-insulator-metal (MIM) capacitors connected together in parallel by a pair of conductive traces, wherein one of the conductive traces is connected to a first supply line and the other is connected to a second supply line; and
a fusible trace located on an end of one of the pair of conductive traces that connects the parallel capacitors to one of the first or second supply lines, such that failure of a dielectric in one of the MIM capacitors in the parallel capacitors causes the fusible trace to at least partially open thereby limiting a fault current in one of the plurality of capacitor columns.

2. The IC capacitor bank as recited in claim 1 wherein the pair of supply lines provides two different ones selected from the group consisting of:
a current sourcing voltage;
a current sinking voltage; and
a common reference point.

3. The IC capacitor bank as recited in claim 1 wherein a width of the fusible trace is less than the narrower width of the pair of conductive traces connected to it such that a ratio of conductive trace width to fusible trace width ranges from about 9:1 to 12:1.

4. The IC capacitor bank as recited in claim 1 wherein the fusible trace provides a length to width ratio ranging from about 100:1 to 150:1.

5. The IC capacitor bank as recited in claim 1 wherein the fault current corresponds to a capacitor column current ranging from about one to five milliamperes.

6. The IC capacitor bank as recited in claim 1 wherein the fusible trace at least partially open corresponds to an electrical resistance increase of at least 50 times over an initial electrical resistance of the fusible trace.

7. The IC capacitor bank as recited in claim 1 wherein the fusible trace includes a fusing material that is selected from the group consisting of:
polycrystalline silicon;
silicided poly-silicon;
tantalum nitride; and
a fusible metal.

8. The IC capacitor bank as recited in claim 1 wherein the fusible trace includes a composite structure having a runner portion and a liner/barrier layer.

9. The IC capacitor bank as recited in claim 1 wherein the fusible trace includes a path liner that determines an increase in electrical resistance for limiting the fault current in the capacitor column.

10. The IC capacitor bank as recited in claim 9 wherein the path liner is a refractory metal liner.

11. A method of manufacturing an integrated circuit (IC) capacitor bank, comprising:
providing a plurality of capacitor columns wherein forming each of the capacitor columns further comprises:
providing a plurality of high dielectric constant (high-k) metal-insulator-metal (MIM) capacitors;
connecting the plurality of MIM capacitors together in parallel with a pair of conductive traces, wherein one of the conductive traces is connected to a first supply line and the other of the conductive traces is connected to a second supply line; and
locating a fusible trace on an end of one of the pair of conductive traces that connects the parallel capacitors to one of the first or second supply lines, such that failure of a dielectric in one of the MIM capacitors in the parallel capacitors causes the fusible trace to at least partially open thereby limiting a fault current in one of the plurality of capacitor columns.

12. The method as recited in claim 11 wherein locating the fusible trace includes the pair of supply lines providing two different ones selected from the group consisting of:
a current sourcing voltage;
a current sinking voltage; and
a common reference point.

13. The method as recited in claim 11 wherein locating the fusible trace includes providing a width of the fusible trace that is less than the narrower width of the pair of conductive traces connected to it such that a ratio of conductive trace width to fusible trace width ranges from about 9:1 to 12:1.

14. The method as recited in claim 11 wherein locating the fusible trace includes providing a length to width ratio of the fusible trace that ranges from about 100:1 to 150:1.

15. The method as recited in claim 11 wherein locating the fusible trace includes limiting the fault current in the capacitor column to a range of about one to five milliamperes.

16. The method as recited in claim 11 wherein locating the fusible trace includes providing for the fusible trace to at least partially open by increasing its electrical resistance by at least 50 times over its initial electrical resistance.

17. The method as recited in claim 11 wherein locating the fusible trace includes providing a fusing material that is selected from the group consisting of:
polycrystalline silicon;
silicided poly-silicon;
tantalum nitride; and
a fusible metal.

18. The method as recited in claim 11 wherein locating the fusible trace includes providing a composite structure for the fusible trace having a runner portion and a liner/barrier layer.

19. The method as recited in claim 11 wherein locating the fusible trace includes providing a path liner for the fusible trace that determines an increase in electrical resistance for limiting the fault current in the capacitor column.

20. The method as recited in claim 19 wherein locating the fusible trace includes providing the path liner as a refractory metal liner.